United States Patent
Jouanneau et al.

(10) Patent No.: US 8,962,496 B2
(45) Date of Patent: Feb. 24, 2015

(54) PROCESS FOR SMOOTHING A SURFACE VIA HEAT TREATMENT

(71) Applicant: Commissariat á l'Energie Atomique et aux Energies Alternatives, Paris (FR)

(72) Inventors: Thomas Jouanneau, Sassenage (FR); Yann Bogumilowicz, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/354,716

(22) PCT Filed: Oct. 26, 2012

(86) PCT No.: PCT/FR2012/000436
§ 371 (c)(1),
(2) Date: Apr. 28, 2014

(87) PCT Pub. No.: WO2013/060949
PCT Pub. Date: May 2, 2013

(65) Prior Publication Data
US 2014/0315394 A1     Oct. 23, 2014

(30) Foreign Application Priority Data

Oct. 27, 2011    (FR) ..................................... 11 03276

(51) Int. Cl.
*H01L 21/26*       (2006.01)
*H01L 21/302*      (2006.01)
(Continued)

(52) U.S. Cl.
CPC .......... *H01L 21/302* (2013.01); *H01L 21/3245* (2013.01); *H01L 21/3247* (2013.01); *H01L 21/76254* (2013.01); *H01L 21/26506* (2013.01)
USPC .......... 438/796; 438/603; 438/675; 438/681; 438/689

(58) Field of Classification Search
None
See application file for complete search history.

(56) References Cited

U.S. PATENT DOCUMENTS

| 4,830,987 A | 5/1989 | Miller et al. |
| 2002/0090818 A1* | 7/2002 | Thilderkvist et al. ......... 438/689 |
| 2005/0196936 A1 | 9/2005 | Daval et al. |

FOREIGN PATENT DOCUMENTS

| EP | 1 363 322 A2 | 11/2003 |
| EP | 1 614 775 A2 | 1/2006 |

(Continued)

OTHER PUBLICATIONS

Smith et al., "Surface topography changes during the growth of GaAs by molecular beam epitaxy," *Applied Physics Letters*, Dec. 16, 1991, vol. 59, pp. 3282-3284, AIP Publishing.
(Continued)

*Primary Examiner* — Kyoung Lee
(74) *Attorney, Agent, or Firm* — Oliff PLC

(57) ABSTRACT

The process for smoothing a rough surface of a first substrate made of a semiconductor alloy based on at least two elements chosen from Ga, As, Al, In, P and N is implemented by placing a second substrate facing the first substrate so that the rough surface is placed facing a surface of the second substrate. The first and second substrates are separated by a distance d of at least 10 μm, the facing portions of the two substrates defining a confinement space. The first substrate is then heated so as to partially desorb one of the elements of said alloy and to reach the saturated vapor pressure of this element in the confinement space and to obtain a surface atom mobility that is sufficient to reduce the roughness of the rough surface.

11 Claims, 4 Drawing Sheets

(51) Int. Cl.
  *H01L 21/324* (2006.01)
  *H01L 21/762* (2006.01)
  *H01L 21/265* (2006.01)

(56) References Cited

FOREIGN PATENT DOCUMENTS

FR    2 867 307       9/2005
JP    A-2005-217374   8/2005

OTHER PUBLICATIONS

Armiento et al., "Capless Rapid Thermal Annealing of GaAs Implanted with Si Using an Enhanced Overpressure Proximity Method," *Journal of the Electrochemical Society*, Aug. 1, 1987, Vo. 134, No. 8A, pp. 2010-2017.

Apr. 12, 2013 International Search Report issued in International Application No. PCT/FR2012/00436.

\* cited by examiner

PROCESS FOR SMOOTHING A SURFACE VIA HEAT TREATMENT

BACKGROUND OF THE INVENTION

The invention relates to a smoothing process, using heat treatment, of a rough surface of a first substrate comprising at the surface a semiconductor alloy based on at least two elements chosen from Ga, As, Al, In, P and N.

STATE OF THE ART

Substrates made from semiconductor material are generally obtained by dicing an ingot made from the same semiconductor material. The dicing process produces substrates having rough surfaces and comprising structural defects such as dislocations in the crystal lattice. A technique also exists involving transfer of thin films of semiconductor material, known under the name of Smart Cut™. This technique in general comprises three steps: a first step of ion implantation of hydrogen and/or of rare gases to create a weakened buried layer in the initial substrate, a second step of securing the initial substrate with a receiver substrate (or strengthener), and a third step of heat treatment to obtain a split off at the level of the weakened area. This weakening step can be assisted by application of mechanical forces. The surfaces obtained after splitting, in particular in the case of transfer of thin layers of gallium and arsenic alloy (GaAs) or of indium and phosphorus alloy (InP) present a large roughness, incompatible with the targeted application.

After the dicing process and after the Smart Cut™ process, it is necessary to reduce the surface roughness of the substrates before using them, in particular for fabricating a microelectronic device. The surface roughness is commonly evaluated by Atomic Force Microscopy abbreviated to AFM. This device enables measurement of the RMS (Root Mean Square) roughness which corresponds to the value of the mean quadratic deviation of the roughness. On a scanned surface of a few $\mu m^2$, the RMS roughness quantifies the height of the roughness peaks and valleys as a mean with respect to the mean height. Unless indicated otherwise, the roughness values provided in the following will be RMS values measured by AFM on a scanned surface of 5 $\mu m \times 5$ $\mu m$.

In order to reduce the surface roughness of the semiconductor material substrates, chemical mechanical polishing (CMP) is one of the most widely used solutions in the microelectronics field. This solution is however onerous and requires a relatively long implementation time for very rough surfaces. To reduce the roughness of a substrate, an alternative solution using thermal smoothing can also be implemented. This solution consists in performing heat treatment of the substrate at high temperature. The heat treatment enables the surface atoms to be given a mobility, which enables the surface energy to be decreased reducing the roughness. This solution is mainly used for silicon substrates. Transposition of this thermal smoothing technique to semiconductor alloy substrates, for example made from GaAs or from InP, does however remain difficult to achieve.

Indeed, when heat treatment is performed at high temperatures, typically above 500° C. for GaAs and InP, these semiconductor alloys can decompose. This phenomenon can be avoided by performing heat treatment in specific atmospheres. Smith et al., in the article entitled "Surface topography changes during the growth of GaAs by molecular beam epitaxy", Applied Physics Letters, 59(25), (1991), describe for example the use of a heat treatment in an atmosphere containing arsenic to improve the roughness of a GaAs substrate. However, this type of heat treatment requires handling of dangerous gases such as arsine ($AsH_3$) and means that a costly specific installation has to be set up.

French patent application FR 2867307 further describes performance of specific heat treatment for healing the crystalline structure after a splitting step obtained by the Smart Cut™ process. This process applies to all semiconductor materials and more particularly to the semiconductor based on silicon and germanium alloy (SiGe). This heat treatment also has the effect of smoothing the surfaces obtained after splitting whereas the surfaces are still in contact. Precautions have to be taken in contact when performing this heat treatment, in particular in terms of thermal budget (heat treatment time and temperature couple) in order to prevent the two surfaces in contact from rebonding to one another in irreversible manner. Furthermore, scratches may appear on the surfaces as the surfaces remain in contact after splitting. The scratches can in fact originate from the presence of particles or of peaks of material which appear at the moment splitting between the facing surfaces takes place.

OBJECT OF THE INVENTION

In certain micro- and nanotechnology fields, a requirement exists to provide substrates presenting at least at the surface a semiconductor alloy based on at least two elements chosen from Ga, As, Al, In, P and N, with smooth surfaces obtained according to a process that is easy to implement, inexpensive and avoids the use of dangerous gases.

This requirement tends to be met by providing a method for smoothing a rough surface of a first substrate made from a semiconductor alloy based on at least two elements chosen from Ga, As, Al, In, P and N, wherein a second substrate is placed facing the first substrate so that the rough surface of the first substrate is facing a surface of the second substrate. The two substrates are separated by a distance d at least equal to 10 $\mu m$, the facing portions of the first and second substrates thus defining a confinement space. Said smoothing method also comprises a heating step of the first substrate so as to partially desorb one of the elements of said alloy and to reach the saturated vapor pressure of this element in the confinement space and to obtain a surface atom mobility that is sufficient to reduce the roughness of the rough surface.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

A dependable, practical and inexpensive means for producing substrates comprising a semiconductor alloy based on at least two elements chosen from Ga, As, Al, In, P and N having at least one smooth surface devoid of structural defects consists in using smoothing by heat treatment with standard equipment and atmospheres by locally creating an atmosphere preventing a great decomposition of this alloy, at the level of the surface to be treated.

For activation of dopants or to improve the electric properties of substrates made from semiconductor alloys, for example from GaAs or InP, it has already been proposed to perform heat treatment by placing two substrates on top of one another. This solution, called proximity cap, enables the decomposition phenomenon of substrates made from semiconductor alloys to be limited when these specific heat treatments are performed.

Figure 1:
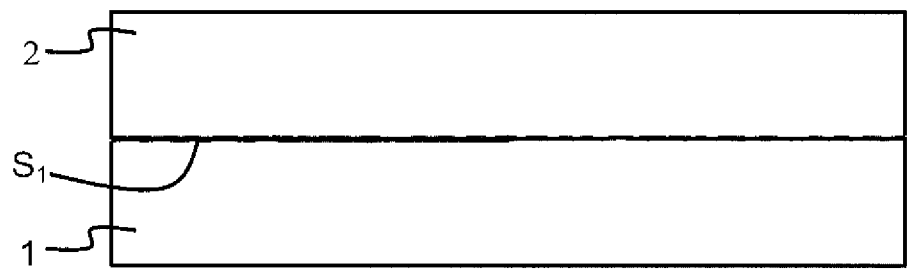
FIG. 1 schematically represents a cross-section of an embodiment of a heat treatment method of a substrate by proximity cap.

As represented in FIG. 1, the proximity method consists in placing a protection substrate 2 on the useful surface $S_1$ of a substrate 1 and in thermally treating substrate 1 protected in this way. Protection substrate 2 is chosen so as to create a local atmosphere with substrate 1, in the vicinity of useful surface $S_1$, which limits decomposition of the semiconductor alloy when heat treatment is performed. For example, when substrates 1 and 2 are made from GaAs, a local atmosphere saturated with arsenic is created between the two substrates 1 and 2 placed in contact, when the heat treatment is performed. This local atmosphere is generated by a slight temporary decomposition of GaAs on each surface of substrates 1 and 2 placed in contact. Saturation of the local atmosphere with arsenic thereby prevents decomposition of useful surface $S_1$ of substrate 1 made from GaAs when heat treatment is performed.

Heat treatments of the prior art for activation of dopants or for improving the electric properties were performed on smooth surfaces with limited thermal budgets typically for 10 minutes at 650° C., or for 1 minute at 700° C. or for 20 seconds at 1000° C. No effect was observed on the roughness.

Transposition of the proximity cap method to the field of surface treatment, in particular to smoothing of substrates made from semiconductor alloys, is not suitable as thermal smoothing requires a heat treatment with a large thermal budget. But if a high temperature is applied, this type of heat treatment is liable to cause adherence of the two substrates placed on one another in a proximity cap method. To prevent problems of bonding, a substrate comprising a surface to be smoothed can be separated from another substrate by a non-nil distance d during a smoothing heat treatment as described in detail in the following example.

Figure 2:
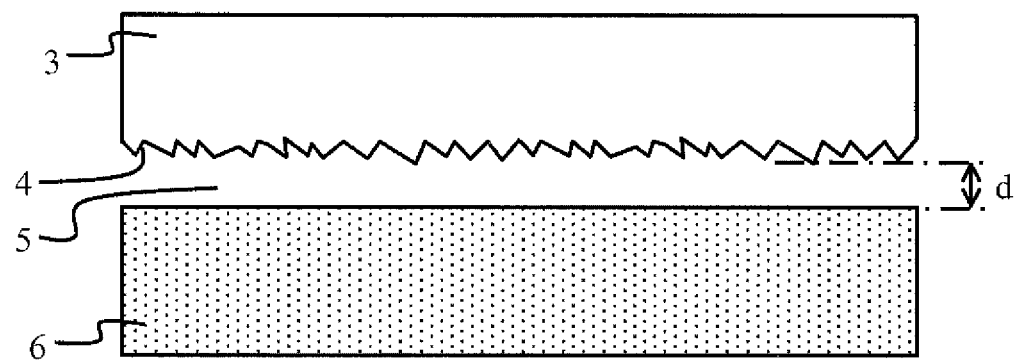
FIG. 2 schematically represents a cross-section of a first embodiment of a process for smoothing a rough surface of a substrate according to the invention.

According to a particular embodiment represented in FIG. 2, a method for smoothing a rough surface 4 of a first substrate 3 uses a second substrate 6. Said rough surface 4 is made from semiconductor alloy based on at least two elements chosen from Ga, As, Al, In, P, and N. Preferably, said alloy is a III-V type semiconductor alloy. The alloy of rough surface 4 can also be a doped semiconductor alloy. For example, semiconductor alloy can be doped by an element chosen from Si, Ge, Cr, Fe, S, Sn and Zn, with an atomic proportion of less than 1 per thousand.

Second substrate 6 is placed facing first substrate 3, the two substrates being separated by a distance d at least equal to 10 μm so that the two facing surfaces defining the confinement space cannot adhere to one another when heat treatment is performed. The two materials forming the two surfaces of the two facing substrates 3 and 6 are not in direct contact. Advantageously, first 3 and second 6 substrates are not in contact. In other words, no element or part of second substrate 6 is in contact with an element or a part of first substrate 3. Second substrate 6 is further arranged in such a way that rough surface 4 is separated from a surface of second substrate 6 by distance d which is at least equal to 10 μm. The facing portions of first and second substrates 3 and 6 thereby define a confinement space 5. Advantageously, confinement space 5 is an open space which prevents any problem of overpressure between the two facing substrates thereby avoiding weakening of the substrates. What is meant by rough surface is a surface presenting asperities and requiring treatment to reduce its asperities before said surface is used. A rough surface typically has a measured roughness of more than 5 nm RMS.

What is meant by the fact that rough surface 4 and surface of substrate 6 are separated by a distance at least equal to 10 μm is that for any 1 μm×1 μm sample of this rough surface 4, the distance between the mid-plane of this sample and the mid-plane of the 1 μm×1 μm sample of the surface of the facing second substrate 6 is at least 10 μm, the mid-plane on a sample being defined by its height $z_m$ with respect to an arbitrary reference plane according to the formula:

$$z_m = \frac{1}{m \times n} \sum_{i=1}^{m} \sum_{j=1}^{n} z(i,j)$$

where z(i,j) represents the height of a point (i,j) of the sample with respect to this reference plane, 256×256 points being measured per sample.

First substrate 3 is then heated so as to partially desorb one of the elements of said semiconductor alloy and to reach a saturated vapor pressure of this element in the confinement space. In other words, heat treatment is performed so as to heat first substrate 3. Separating distance d, and also the temperature and duration of the heat treatment, are chosen in such a way as to obtain an atmosphere containing a saturated vapor of one of the elements of the semiconductor alloy of rough surface 4 and to provide a sufficient surface atom mobility to reduce the roughness. Distance d enables bonding of rough surface 4 and of the surface of second substrate 6 to be prevented when the heat treatment is implemented. The heat treatment can therefore be performed at high temperature to obtain fast and efficient smoothing of rough surface 4, preventing any risk of bonding.

Preferably, the heat treatment designed to heat first substrate 3 is performed at a temperature of more than 500° C. This heat treatment must of course be performed at a lower temperature than the melting temperature of the semiconductor alloy.

First 3 and second 6 substrates are not in direct contact and separation of rough surface 4 from the surface of second substrate 6 can be performed by any known means, preferably by means of a wedge having a thickness at least equal to the separating distance d. Thus, between first 3 and second 6 substrates, there is mainly an absence of material, with wedges located locally. The locations of the wedges are arranged so as to have an open confinement space. For example purposes, wedges (not represented in the figures) having a thickness at least equal to the distance d can be arranged on the surface of second substrate 6. The position of these wedges on second substrate 6, the bow of the surface of first and second substrates 3 and 6 and the total thickness variation (TTV) of the substrates will in particular be taken into account to define the necessary thickness of the wedges. First substrate 3 is then placed on these wedges. The wedges are preferably arranged in such a way as to be in contact only with the peripheral edges of first substrate 3. Furthermore, the wedges are chosen in such a way as to prevent any bonding with first 3 and second 6 substrates. Preferably, the wedges are made from a different material than the material of first substrate 3 and the material of second substrate 6. The wedges can also be made from a base formed by a material having characteristics which do not encourage bonding of said material with first and second substrates 3 and 6, such as quartz, silicon or silicon carbide (SiC). The wedges can further have a surface quality, for example a surface that is very rough or comprises little contact surface, enabling bonding between the wedges and first 3 and second 6 substrates to be prevented. As a variant, it is possible to provide securing mechanisms of substrates 3 and 6. For example purposes, substrate suction means can be used to keep substrates 3 and 6 at a given separating distance d.

The method for smoothing rough surface 4 comprises an essential heat treatment step. This step is performed so as to provide a large thermal budget for the surface atoms. Depending on the nature of the semiconductor alloy of rough surface 4, a thermal budget will be chosen that is sufficiently efficient for the surface atoms to be able to acquire a mobility enabling the surface energy to be decreased and the roughness to be reduced. Typically, for GaAs and InP, the thermal budget will be about or even slightly more than 30 minutes at 700° C. and more than 2 minutes at 1000° C.

The heat treatment step is performed by means of any known method, for example using a conventional tubular furnace or a RTA (Rapid Thermal Annealing) furnace.

Astute arrangement of substrate 3 with respect to the surface of second substrate 6 enables conventional heat treatment to be used for smoothing rough surface 4. Indeed, depending on the embodiment, thermal smoothing is performed using a heat treatment in conventional atmospheres, for example neutral atmospheres such as nitrogen ($N_2$), helium (He) or argon (Ar) or a mixture comprising one of these gases, for example a mixture of $N_2$ and $H_2$. At the beginning of the heat treatment, the semiconductor alloy of rough surface 4 decomposes locally creating an atmosphere enriched by at least one of the chemical elements constituting the semiconductor alloy. Confinement space 5 then comprises a local atmosphere saturated by this chemical element, which subsequently enables decomposition of rough surface 4 to be minimised.

Furthermore, keeping rough surface 4 and the surface of substrate 6 at a distance of at least 10 μm advantageously prevents any risk of direct bonding between these two surfaces. The constraints on the conditions of the smoothing heat treatment are thereby relaxed. In other words, it is possible to implement heat treatment at a higher temperature or for a longer time without any risk of bonding. Increasing the temperature of the heat treatment enables smoothing to be obtained that is either equivalent or even of better quality with a shorter heat treatment period, which makes the smoothing process less expensive and more efficient.

Separating distance d between rough surface 4 and the surface of second substrate 6 is preferably chosen so as to be as small as possible. The efficiency of the confinement does in fact depend on the ease of saturating confinement space 5 with an element of the semiconductor alloy of first substrate 3: the larger this distance d, the larger the volume to be saturated will be. Furthermore, increasing the distance d facilitates leakage of the saturating species to the outside of confinement space 5. Advantageously, separating distance d is smaller than 2 mm, even 1 mm or 500 nm.

By adjusting separating distance d and providing a sufficient thermal budget to first substrate 3, the roughness of surface 4 can be reduced while at the same time preventing decomposition of the alloy of first substrate 3.

Second substrate 6 can for example be a substrate support made from thermally stable material with respect to first substrate 3, i.e. it withstands higher temperatures than the melting temperature of the material of first substrate 3 (about 1238° C. for GaAs and about 1062° C. for InP). Second substrate 6 is preferably a wafer receiver support for a RTA furnace, for example a graphite susceptor comprising a coating made from silicon carbide alloy (SiC).

In order to ensure thermal smoothing of rough surface 4, the heat treatment is performed at relatively high temperatures, for example comprised between 800 and 1200° C. for GaAs and between 700 and 1000° C. for InP. However, to keep the same structural characteristics of first substrate 3, the heat treatment is advantageously performed at a lower temperature than the melting temperature of the semiconductor alloy of substrate 3.

The semiconductor alloy of first substrate 3 is preferably a semiconductor alloy based on GaAs, in which case heat treatment is advantageously performed at a temperature higher than or equal to 700° C., even higher than 800° C. or 900° C. but lower than its melting temperature, and therefore typically lower than 1200° C. The semiconductor alloy of first substrate 3 can also be an InP alloy, in which case the heat treatment is advantageously performed at a temperature higher than or equal to 600° C., even higher than 700° C. or 800° C. but lower than its melting temperature, and therefore typically lower than 1000° C.

Figure 3:
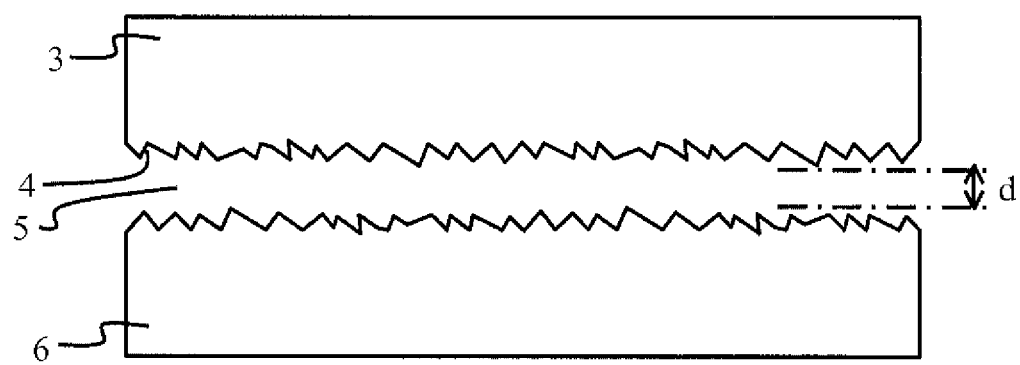
FIG. 3 schematically represents a cross-section of a second embodiment of a process for smoothing a rough surface of a substrate according to the invention.

According to another particular embodiment represented in FIG. 3, the surface of second substrate 6 comprises a semiconductor alloy based on at least two elements chosen from Ga, As, Al, In, P and N. The semiconductor alloy of the surface of second substrate 6 is preferably identical to that of rough surface 4. The surface of second substrate 6 can be rough, typically having a RMS roughness of more than 5 nm. According to this embodiment, a faster saturation of confinement space 5 can be achieved as the surfaces of first and second substrates 3 and 6 participate therein, thereby enabling simultaneous smoothing of rough surface 4 and of the surface of second substrate 6.

Separating distance d is preferably about equal to the sum of the respective maximum curvatures of substrates 3 and 6, to which a margin is added to take account of the variation of the thickness of substrates 3 and 6. For example, for 100 mm wafers, the maximum curvature is about 20 μm. Thus, for 100 mm wafers (substrates 3 and 6), separating distance d when the smoothing heat treatment is performed will typically be about 50 μm.

For example purposes, a smoothing process using heat treatment of a rough surface made from GaAs was implemented. This surface was obtained following transfer of a layer of GaAs onto a support substrate made from silicon, by means of the Smart Cut™ process. The implantation conditions for transfer of the GaAs were the following: co-implantation of $5*10^{15}$ He$^+$/cm$^2$ at 105 keV and of $3*10^{16}$ H$_2^+$/cm$^2$ at 160 keV. Splitting was obtained at a temperature of about 230° C. The splitting step produced a GaAs surface having a measured roughness of 21 nm RMS.

The substrates obtained in this way were annealed, at ambient pressure, in a standard RTA furnace in a neutral atmosphere ($N_2$). Before each heat treatment, the substrates were arranged two by two with their GaAs surfaces facing one another. The GaAs substrates of each couple were separated by wedges having thicknesses comprised between 50 µm and 400 µm. The measured surface roughness was reduced for smoothing heat treatment temperatures higher than or equal to 700° C. In particular, for a treatment at 1000° C. for 2 min and a separating distance d of 50 µm between the GaAs surfaces, the roughness was reduced to 3.2 nm RMS.

The measured roughness of the GaAs surfaces decreases continuously as the separating distance d decreases. The roughness was in fact reduced from 4.6 nm RMS to 3.8 nm RMS and then to 3.2 nm RMS when the thickness of the wedges was reduced from 400 to 220 µm and then to 50 µm.

For comparative example purposes, GaAs substrates were annealed in a tube furnace in a $N_2$ atmosphere, at reduced pressure and at a temperature of 800° C. for one hour. Each GaAs substrate was placed in a slot of a quartz boat before being inserted in the furnace. The slots being spaced apart by about 4 mm, the GaAs substrates were able to be annealed in a facing arrangement with a separating distance d of about 4 mm. With these heat treatment conditions, the surface roughness of the GaAs substrates was greatly increased thereby making measurement of the roughness by interferometry impossible. This large increase of the roughness of the annealed GaAs substrates, according to this arrangement, is generated by the decomposition of the surface of the GaAs substrates. Separating distance d between the GaAs substrates is in fact too large and enables a flow of the gaseous nitrogen flux in the vicinity of the surfaces of the GaAs substrates and local arsenic saturation is no longer possible.

Similar tests were performed after transfer of a InP layer by the Smart Cut™ method. The splitting step generated two rough InP surfaces, at least one of which has a measured roughness of 14 nm RMS. The two InP surfaces obtained after the splitting step were placed facing one another so as to be separated by 50 µm wedges. Heat treatment in a RTA furnace at 700° C. for 30 minutes of the two InP surfaces separated by 50 µm wedges then enabled the roughness to be reduced to about 4 nm RMS. Heat treatment at 800° C. for 30 minutes followed by a proximity cap configuration resulted in bonding of the two InP surfaces.

Figure 4:
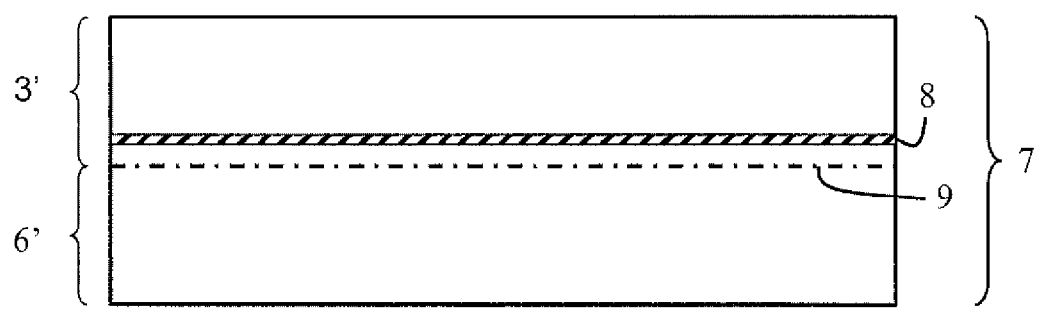
FIGS. 4 and 5 schematically represent cross-sections of a variant of the second embodiment of a process for smoothing a rough surface of a substrate according to the invention.
Figure 5:
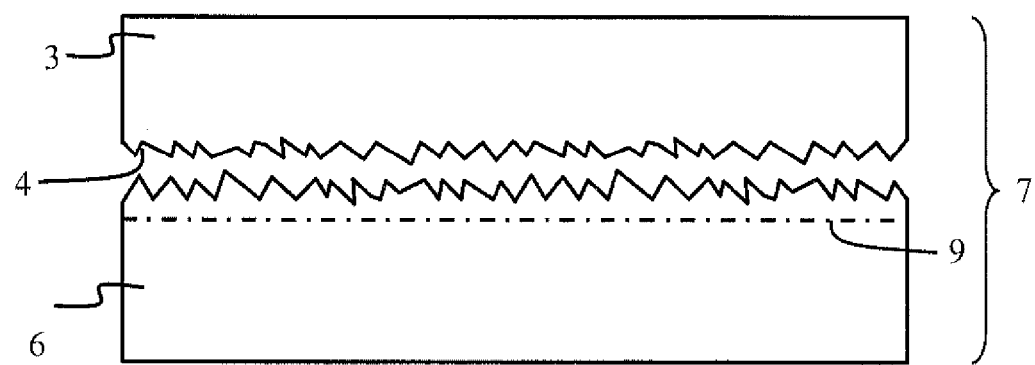

According to a particular embodiment of implementation represented in FIGS. 4 and 5, the rough surfaces are obtained from one and the same support 7. As illustrated in FIG. 4, a weakened area 8 is produced inside support 7. Weakened area 8 is advantageously obtained by means of implantation of a weakening element. Support 7 can be formed by bonding of a donor wafer 3' and of a receiver wafer 6' after the implementation step of the weakening element in the donor wafer 3'. Bonding is performed at the level of bonding interface 9. As illustrated in FIG. 5, support 7 is then separated at the level of weakened area 8 to form first and second substrates 3 and 6. Rough surface 4 of first substrate 3 and the surface of second substrate 6 are formed by weakened area 8. Weakened area 8 is advantageously obtained by means of implantation of hydrogen and/or of rare gases, and the separation step is performed by means of heat treatment.

After the separation step, mechanical means are used to maintain first and second substrates 3 and 6 at a separating distance d of more than 10 µm, preferably about 50 µm. These mechanical means can for example comprise wedges arranged in substantially regular manner around the periphery of substrates 3 and 6, preferably at the level of the bevel. The mechanical means can also consist of insertion means such as a blade or a guillotine or of suction means arranged on each side of the substrates. Heat treatment enabling smoothing of the surfaces of substrates 3 and 6 is then performed as described in the foregoing.

Figure 6A:
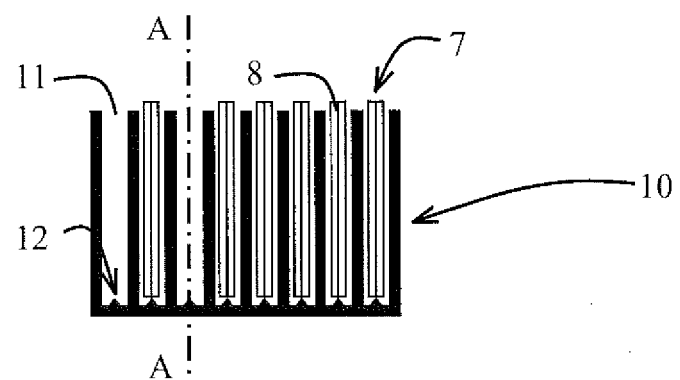
FIGS. 6A to 6C schematically represent in cross-section a boat used in an embodiment of a process for smoothing a rough surface of a substrate according to the invention.
Figure 6B:
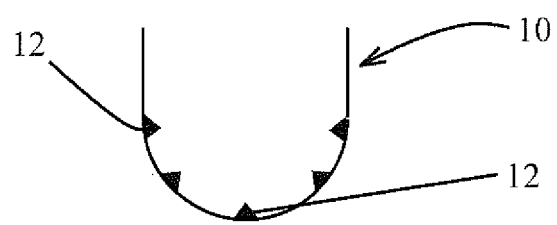
Figure 6C:
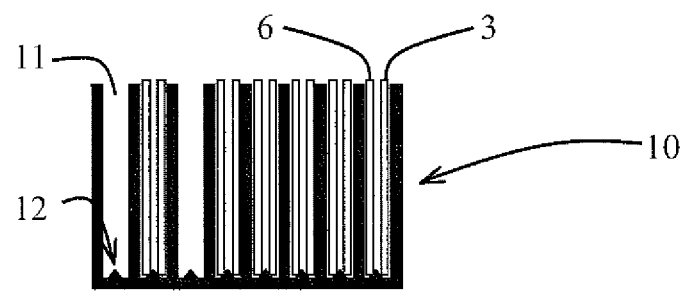

Advantageously, the separation heat treatment and the smoothing heat treatment are performed in the same furnace. As illustrated in FIGS. 6A to 6C, the smoothing method according to the invention is advantageously used in association with the Smart Cut™ method to obtain surfaces with a low roughness, in particular made from GaAs or InP. Such materials can for example be transferred onto silicon substrates. The separation or splitting step is performed collectively.

According to an example embodiment, a large number of supports 7 to be separated are placed vertically in slots 11 of a boat 10, advantageously made from quartz (FIG. 6A). Slots 11 of boat 10 are separated from one another by a distance of up to 4 mm. The boat is then inserted in a furnace to undergo a heat treatment step designed to separate each support at the level of weakened area 8 obtained by implantation. This separation heat treatment is performed between 200 and 300° C. depending on the weakening implantation conditions. As a variant, the separation heat treatment can be assisted by application of mechanical forces. As illustrated in FIG. 6B, each slot 11 of boat 10 is provided with wedges 12, for example arranged in substantially regular manner around the periphery of supports 7, in particular at the level of the bevel. Wedges 12 are designed to maintain the obtained surfaces (the surfaces of first 3 and second 6 substrates) after splitting at a separating distance of about 50 µm. Wedges 12 can also serve the purpose of inducing separation.

As illustrated in FIG. 6C, after the step of splitting and of maintaining the obtained substrates 3 and 6 at a separating distance, the temperature of the furnace is increased. The furnace thus enables smoothing heat treatment of first 3 and second 6 substrates to be performed as described in the foregoing. For transferred surfaces made from InP, the heat treatment is preferably performed at 800° C. for 30 minutes. This method enabled the roughness to be reduced from 14 nm RMS after the splitting step to 4 nm RMS after the smoothing heat treatment. In similar manner, for transferred surfaces made from GaAs, smoothing heat treatment, under the same conditions, enabled a roughness of about 3 nm RMS to be obtained, as compared with a roughness of 21 nm RMS measured after the splitting step.

It is also possible to associate the smoothing heat treatment according to the invention with an additional CMP step in order to further reduce the surface roughness. This additional CMP step is shorter than a usual CMP step, and is therefore less onerous than if it had been performed without prior smoothing heat treatment.

The invention claimed is:

1. A smoothing process of a rough surface of a first substrate comprising the following steps:
   providing the first substrate with the rough surface made from a semiconductor alloy based on at least two elements chosen from Ga, As, Al, In, P and N;
   placing a second substrate with a surface facing the rough surface of the first substrate so as to keep the first and second substrates separated by a distance d at least equal to 10 l.tm, the facing rough surface and the surface of the second substrate defining a confinement space;
   heating the first substrate so as to partially desorb one of the elements of the semiconductor alloy and to reach the saturated vapor pressure of this element in the confinement space and to obtain a surface atom mobility that is sufficient to reduce the roughness of the rough surface.

2. The smoothing process according to claim 1, wherein the separating distance d is less than 2 mm.

3. The smoothing process according to claim 1, wherein the alloy of the rough surface is a gallium and arsenic alloy wherein heating is performed at a temperature higher than or equal to 700° C.

4. The smoothing process according to claim 1, wherein the alloy of the rough surface is an indium and phosphorus alloy and wherein the heating is performed at a temperature higher than or equal to 600° C.

5. The smoothing process according to claim 1, wherein the surface of the second substrate comprises a semiconductor alloy based on at least two elements chosen from Ga, As, Al, In, P and N.

6. The smoothing process according to claim 5, wherein the surface of the secondsubstrate is rough and wherein a simultaneous smoothing of the rough surface and of the surface of the second substrate is performed.

7. The smoothing process according to claim 6, wherein the alloy of the surface of the second substrate is identical to that of the rough surface of the first substrate.

8. The smoothing process according to claim 1, wherein the rough surface is separated from the surface of the second substrate by at least one wedge having a thickness at least equal to the separating distance d.

9. The smoothing process according to claim 7, comprising the following steps:
   providing a support comprising a weakened area located inside the support;
   separating the support at the level of the weakened area to foita the first and second substrates, the rough surface of the first substrate and the surface of the second substrate being formed by the weakened area.

10. The smoothing process according to claim 9, wherein the weakened area is obtained by means of implantation of hydrogen and/or of rare gases, and in that separation comprises a heat treatment step.

11. The smoothing process according to claim 1, wherein the first and second substrates are separated by means of wedges arranged around the periphery of said substrates.

* * * * *